US012002653B2

United States Patent
Evans et al.

(10) Patent No.: US 12,002,653 B2
(45) Date of Patent: Jun. 4, 2024

(54) SYSTEMS AND METHODS FOR COMPENSATING FOR RF POWER LOSS

(71) Applicant: Lam Research Corporation, Fremont, CA (US)

(72) Inventors: Mathew Dennis Evans, Fremont, CA (US); Cristofer Addison Flowers, Fremont, CA (US); John Drewery, San Jose, CA (US)

(73) Assignee: Lam Research Corporation, Fremont, CA (US)

( * ) Notice: Subject to any disclaimer, the term of this patent is extended or adjusted under 35 U.S.C. 154(b) by 249 days.

(21) Appl. No.: 17/618,414

(22) PCT Filed: May 27, 2020

(86) PCT No.: PCT/US2020/034698
§ 371 (c)(1),
(2) Date: Dec. 10, 2021

(87) PCT Pub. No.: WO2020/256899
PCT Pub. Date: Dec. 24, 2020

(65) Prior Publication Data
US 2022/0238307 A1    Jul. 28, 2022

Related U.S. Application Data

(60) Provisional application No. 62/864,346, filed on Jun. 20, 2019.

(51) Int. Cl.
*H01J 37/32* (2006.01)
(52) U.S. Cl.
CPC .. *H01J 37/32183* (2013.01); *H01J 37/32926* (2013.01); *H01J 37/32935* (2013.01)

(58) Field of Classification Search
CPC ........... H01J 37/32183; H01J 37/32926; H01J 37/32935; H01J 37/32174; H01J 37/3299;
(Continued)

(56) References Cited

U.S. PATENT DOCUMENTS

2008/0237031 A1* 10/2008 Sato .................. H01J 37/32082
118/712
2015/0252467 A1    9/2015 Allen et al.
(Continued)

FOREIGN PATENT DOCUMENTS

JP    2000-208495 A    7/2000
JP    2017-139164 A    8/2017

OTHER PUBLICATIONS

ISR & Written Opinion PCT/US2020/034698, dated Sep. 11, 2020, 9 pages.

*Primary Examiner* — Abdullah A Riyami
*Assistant Examiner* — Syed M Kaiser
(74) *Attorney, Agent, or Firm* — PENILLA IP, APC

(57) ABSTRACT

Systems and methods for compensating for radio frequency (RF) power loss are described. One of the methods includes conducting a no plasma test to determine a resistance associated with an output of an impedance matching circuit. After conducting the no plasma test, a substrate is processed in a plasma chamber. During processing of the substrate, power loss associated with the output of the impedance matching circuit is determined. The power loss is used to determine an amount of power to be delivered by an RF generator. The amount of power delivered is adjusted until the power loss is stabilized. The stabilization of the power loss facilitates uniform process of the substrate and additional substrates in the plasma chamber.

20 Claims, 7 Drawing Sheets

(58) Field of Classification Search
CPC .. H01J 37/24; H01J 37/3053; H01J 37/32082; H01L 21/3065; H01L 21/67253
See application file for complete search history.

(56) References Cited

U.S. PATENT DOCUMENTS

2016/0118227 A1* 4/2016 Valcore, Jr. ....... H01J 37/32165
216/61
2019/0035608 A1* 1/2019 Jafarian-Tehrani ..........................
H01J 37/32724
2020/0006039 A1* 1/2020 Ghantasala ....... H01J 37/32458

* cited by examiner

FIG. 1 (NPT)

(NPT Results)

FIG. 3 (Processing)

| Time Step | Corrective Offset Applied to Setpoint (W) | Adjusted Generator Setpoint (W) | P_loss (W) | Coupled Power to Plasma (W) | Next Time Step Corrective Offset (W) |
|---|---|---|---|---|---|
| 0 | 0.0 | 500.0 | 5.0 | 495.0 | 5.0 |
| 1 | 5.0 | 505.0 | 8.0 | 497.0 | 8.0 |
| 2 | 8.0 | 508.0 | 9.0 | 499.0 | 9.0 |
| 3 | 9.0 | 509.0 | 10.0 | 499.0 | 10.0 |
| 4 | 10.0 | 510.0 | 10.5 | 499.5 | 10.5 |
| 5 | 10.5 | 510.5 | 10.6 | 499.9 | 10.6 |
| 6 | 10.6 | 510.6 | 10.6 | 500.0 | 10.6 |

FIG. 4

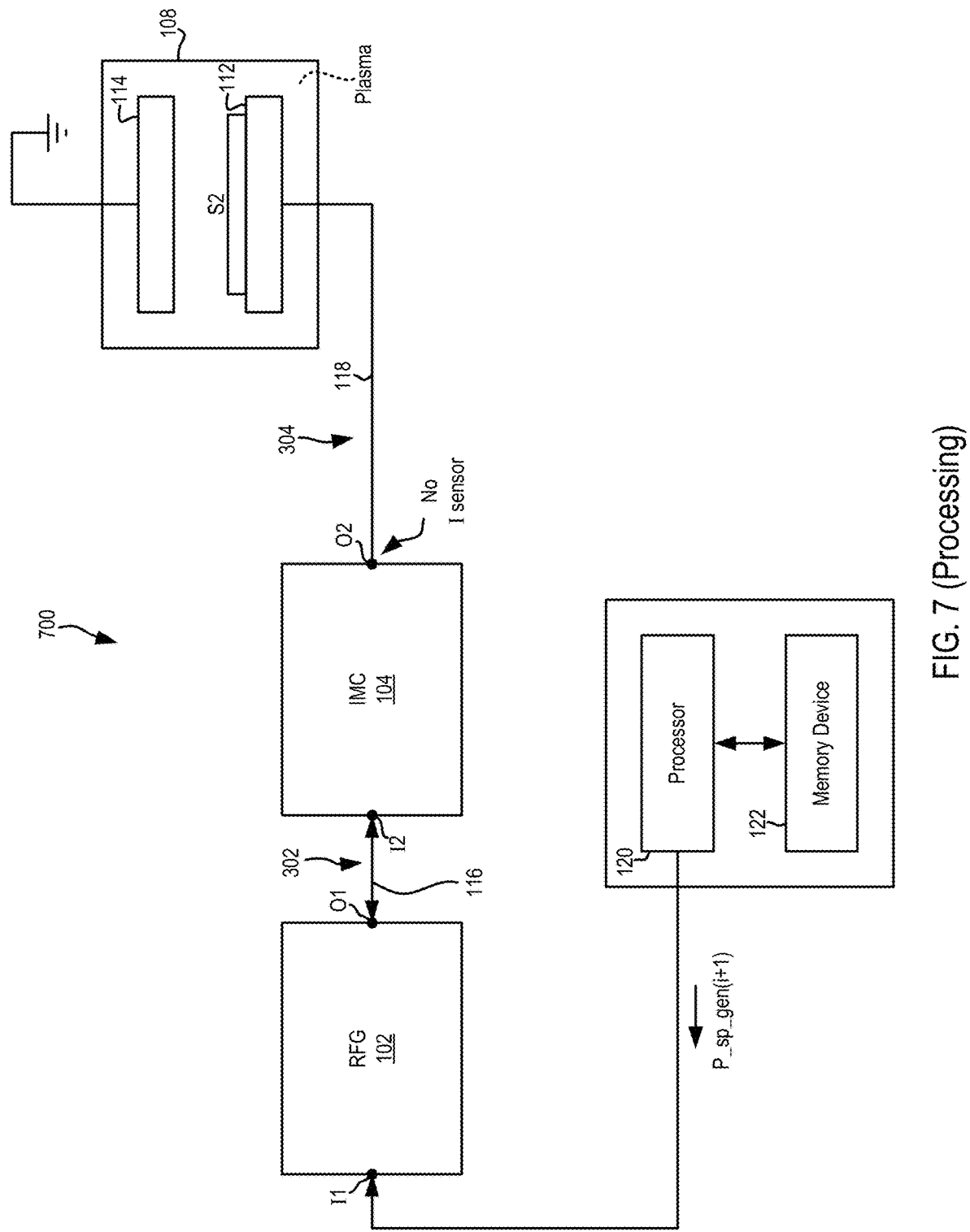
FIG. 7 (Processing)

SYSTEMS AND METHODS FOR COMPENSATING FOR RF POWER LOSS

CLAIM OF PRIORITY

This application is a national stage filing of and claims priority, under 35 U.S.C. § 371, to PCT/US2020/034698, filed on May 27, 2020, and titled "SYSTEMS AND METHODS FOR COMPENSATING FOR RF POWER LOSS", which claims the benefit of and priority, under 35 U.S.C. § 119(e), to U.S. Provisional Patent Application No. 62/864, 346, filed on Jun. 20, 2019, and titled "SYSTEMS AND METHODS FOR COMPENSATING FOR RF POWER LOSS", both of which are incorporated by reference herein in their entirety.

FIELD

The present embodiments relate to systems and methods for compensating for radio frequency (RF) power loss.

BACKGROUND

The background description provided herein is for the purposes of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

A wafer is etched using a plasma tool. The plasma tool includes a radio frequency (RF) generator, a matching network or a match, and a plasma chamber. The RF generator is connected to the match via a coaxial cable, which connects to the plasma chamber via a transmission line. The wafer is placed within the plasma chamber.

Once the wafer is placed, the RF generator is turned on to provide RF power to the plasma chamber via the match and the transmission line. Also, a process gas is supplied to the plasma chamber. When the process gas is ignited by the RF power, plasma is stricken in the plasma chamber. The plasma is used to etch the wafer.

It is in this context that embodiments described in the present disclosure arise.

SUMMARY

Embodiments of the disclosure provide systems, apparatus, methods and computer programs for compensating for radio frequency (RF) power loss. It should be appreciated that the present embodiments can be implemented in numerous ways, e.g., a process, an apparatus, a system, a piece of hardware, or a method on a computer-readable medium. Several embodiments are described below.

Some semiconductor processing tools, such as conductor etch (CE) tools, run a subsystem bias in a voltage control mode, and some in a power control mode. The voltage control mode does not utilize power compensation action. In the power control mode, chamber-to-chamber differences in parasitic power losses yield coupled power variability to a plasma load. To provide an optimal chamber matching performance, the coupled power variability is minimized.

The systems and methods, described herein, provide a compensation method for achieving a corrective action to tighten the chamber-to-chamber coupled power variability. The systems and methods relate to a chamber-matching power compensation scheme for a bias subsystem of a CE tool. The compensation scheme applies to the bias subsystem that runs in a power control mode. The compensation scheme makes use of a current probe placed at an output of a bias matching network. A current measurement received from the current probe allows for or is used to compensate for the parasitic power losses, from the bias matching network all the way to the plasma, to be calculated in real time. These parasitic power losses will be factored out using a modified control loop that continuously updates a power set point of an RF generator. The corrective action provides an offset in the power set point that is equal to the parasitic power losses along a RF feed path in real time.

In some embodiments, to account for the parasitic power losses of the bias matching network and RF feed assembly, a two-step procedure is implemented. The procedure makes use of a probe, such as the current probe or a voltage and current probe or an impedance measurement probe or an impedance scan probe. The probe is placed at the output of the bias matching network. First, a root mean squared (RMS) current is measured by the probe during a no plasma test (NPT). A value of an equivalent series resistance (ESR) of the bias matching network and entire assembly is calculated by performing a linear regression on the measured RMS current squared and power delivered by the RF generator. The ESR value is stored by a host computer and used as a system constant.

Second, a control algorithm is put in place to provide real-time corrective action to the RF generator's recipe power set point, e.g., P_sp_rec, using the ESR value measured above. When a recipe step is running, a power loss, e.g., P_loss, can be calculated at each time increment or time step i using the following equation:

$$P\_loss(i) = ERS * (I\_RMS(i))^2 \tag{1}$$

Here, I_RMS(i) is the RMS current read by the probe at the time increment i. The power loss of the current time step is carried forward and added to the RF generator's recipe power set point P_sp_rec to determine an updated generator power set point, e.g., P_sp_gen, where "sp" represents a set point and "gen" represents the RF generator. The following equation shows the updated generator power set point at the time increment i:

$$P\_sp\_gen(i) = P\_sp\_rec + P\_loss(i-1) \tag{2}$$

The procedure is repeated until the corrective offset P_loss(i) is equal to the measured loss P_loss(i−1). At this point, the parasitic power losses will be accounted for.

Some advantages of the herein described systems and methods compensating for RF power loss, such as the parasitic power losses, include achieving chamber repeatability in processing a substrate or multiple substrates. The RF generator supplies RF power to an electrode in a plasma chamber. The RF power is transferred via an RF path from the RF generator to the electrode. There is loss of a portion of the RF power on the RF path due to characteristics of components of the RF path. Examples of the components include an RF cable, an impedance matching circuit, and an RF transmission line. The RF cable couples the RF generator to the impedance matching circuit, such as the bias matching network. Also, the RF transmission line couples the impedance matching circuit to the plasma chamber. To account for the RF power loss in the RF path, power that is delivered by the RF generator is adjusted. The power delivered by the RF generator is adjusted until the RF power loss stabilizes. After the stabilization of the RF power loss, the RF generator is controlled to deliver the same or substantially the same amount of delivered power. When the same or substantially the same amount of power is delivered by the RF generator, the substrate or the multiple substrates are processed in a uniform manner. For example, a uniform etch rate or a uniform deposition rate is achieved in processing the multiple substrates. As another example, the substrate is processed in a desired manner to achieve an etch rate or a deposition rate.

Other aspects will become apparent from the following detailed description, taken in conjunction with the accompanying drawings.

BRIEF DESCRIPTION OF THE DRAWINGS

The embodiments are understood by reference to the following description taken in conjunction with the accompanying drawings.

FIG. 4 is an embodiment of a table to illustrate a method in which during processing of a substrate, a processor continues to modify the amount of power delivered by the RF generator based on an amount of power loss associated with an output of the impedance matching circuit.

FIG. 7 is a diagram of an embodiment of a system to illustrate that an amount of delivered power determined by applying the method illustrated with respect to FIG. 4 is maintained for processing another substrate.

DETAILED DESCRIPTION

The following embodiments describe systems and methods for compensating for radio frequency (RF) power loss. It will be apparent that the present embodiments may be practiced without some or all of these specific details. In other instances, well known process operations have not been described in detail in order not to unnecessarily obscure the present embodiments.

Figure 1:
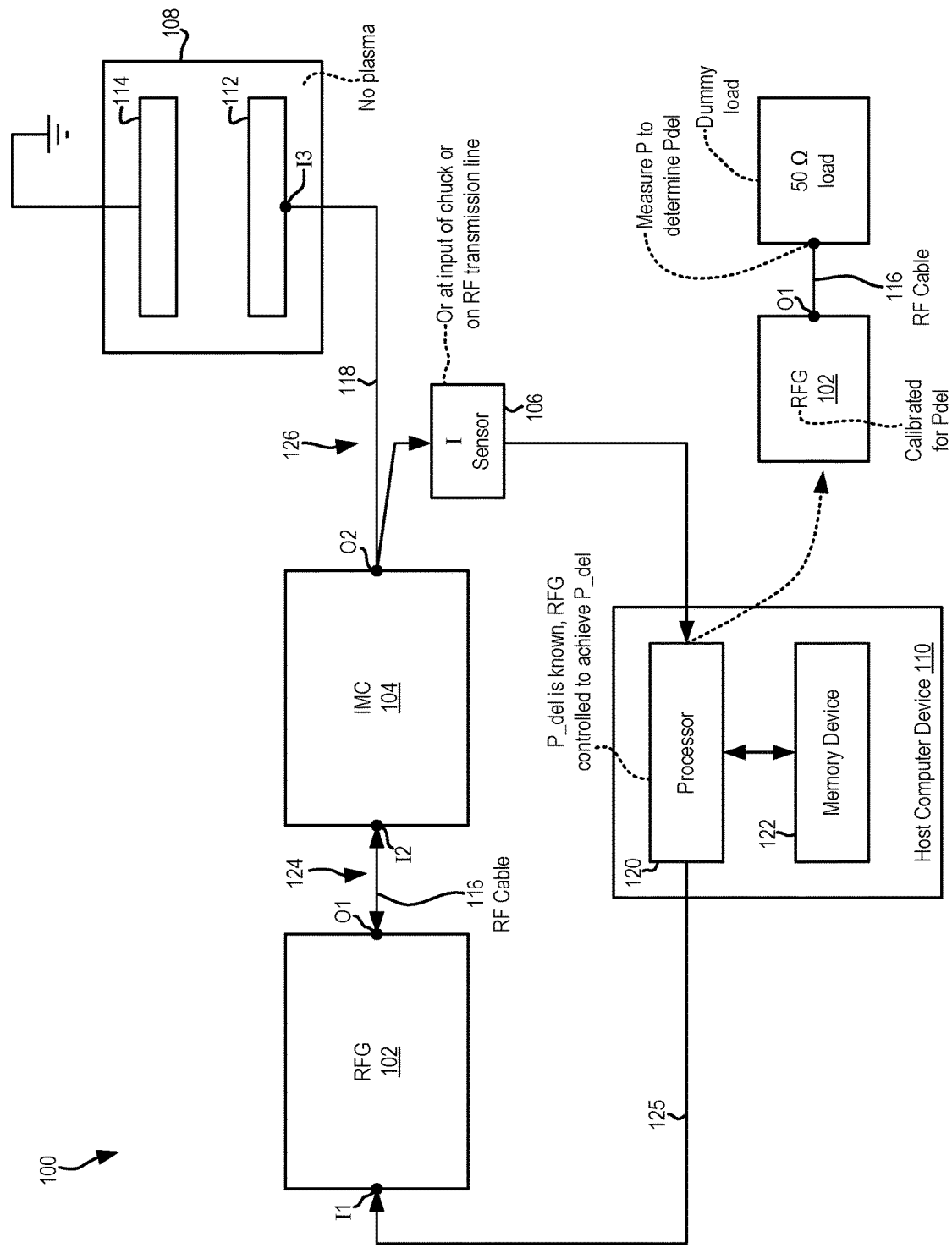
FIG. 1 is a diagram of an embodiment of a system for illustrating a no-plasma test, which is performed before processing a substrate.

FIG. 1 is a diagram of an embodiment of a system 100 for illustrating a no-plasma test, which is performed before processing a substrate. The system 100 includes multiple components, such as an RF generator 102, an impedance matching circuit 104, a current sensor 106, a plasma chamber 108, and a host computing device 110.

Examples of the RF generator 102 include a kilohertz (kHz) RF generator or a megahertz (MHz) RF generator. An example of the kHz RF generator is an RF generator having an operating frequency of 400 kHz. An example of the MHz RF generator includes an RF generator having an operating frequency of 1 MHz RF generator or 2 MHz RF generator or 13.56 MHz RF generator or 27 MHz RF generator or 60 MHz RF generator. The RF generator 102 includes a processor, such as a digital signal processor (DSP), a driver and amplifier circuit, and an RF power supply. The processor is coupled to the driver and amplifier circuit, which is coupled to the RF power supply. An example of the RF power supply includes an RF oscillator.

An example of the impedance matching circuit 104 includes a circuit having a network of circuit components that are coupled with each other in a serial or parallel manner. Examples of a circuit component include a resistor, an inductor, and a capacitor. To illustrate, the circuit component is a shunt capacitor or a series capacitor.

The plasma chamber 108 is a parallel plate plasma chamber, e.g., a capacitively coupled plasma (CCP) chamber. The plasma chamber 108 includes a chuck 112 and an upper electrode 114 that faces the chuck 112. An example of the chuck 112 includes an electrostatic chuck (ESC) that includes a lower electrode and a ceramic plate situated on top of the lower electrode. Each of the chuck 112 and the upper electrode 114 is made from a metal, such as aluminum or an alloy of aluminum. The upper electrode 114 is coupled to a ground potential.

An example of the current sensor 106 includes a voltage and current (VI) probe or a current probe or an impedance sensor or an impedance scanner or an impedance probe. Examples of the host computing device 110 include a computer and a server. The computer may be a desktop computer or a laptop computer or a smart phone or a tablet. The host computing device 110 includes a processor 120 and a memory device 122. Examples of a processor, as used herein, include a central processing unit (CPU), an application specific integrated circuit (ASIC), a programmable logic device (PLD), a controller, a microprocessor, and a microcontroller. Examples of a memory device include a random access memory (RAM) and a read-only memory (ROM). To illustrate, a memory device is a flash memory or a redundant array of independent disks (RAID). The memory device 122 is coupled to the processor 120 via a connection, such as a serial transfer connection, a parallel transfer connection, a bus, or a universal serial bus (USB) connection.

The RF generator 102 is coupled to the impedance matching circuit via an RF cable 116. For example, an output O1 of an RF power supply of the RF generator 102 is coupled via the RF cable 116 to an input I2 of the impedance matching circuit 104. Also, the impedance matching circuit 104 is coupled via an RF transmission line 118 to the lower electrode of the chuck 112. For example, an output O2 of the impedance matching circuit 104 is coupled via the RF transmission line 118 to the lower electrode. The RF transmission line 118 is another example of the component of the plasma system 100 and includes an RF rod, an insulator, and a sleeve. The insulator wraps around the RF rod and the sleeve forms a protective cover surrounding the insulator.

The processor 120 is coupled via a connection cable 125, such as a serial transfer cable, or a parallel transfer cable, an Ethernet cable, or a USB cable, to an input I1 of the RF generator 102. For example, the processor 120 is coupled via the connection cable 125 to the processor of the RF generator 102. The current sensor 106 is coupled via an RF cable to the output O2 of impedance matching circuit 104 and is coupled via a connection cable 121 to the processor 120. Examples of a connection cable are provided above.

During the no plasma test, plasma is not generated within the plasma chamber 108. For example, one or more process gases, such as fluorine containing gas or an oxygen containing gas, are not supplied to the plasma chamber 108 to strike plasma within the plasma chamber 108. Also, in this example, there is no substrate placed on a top surface of the chuck 112 for processing.

The processor 120 provides an instruction signal having amounts of one or more variables, such as a frequency and delivered power, via the connection cable 125 and the input I1 to the RF generator 102. The delivered power is a sum of supplied power and power loss that occurs in the RF cable 116. The supplied power is power generated by the RF generator 102 without receiving the instruction signal that has the amount of the delivered power. For example, the supplied power is power supplied at the output O1 by the RF generator 102 when the loss of power in the RF cable 116 is not accounted for. The amounts of the variables are stored in the memory device 122 for access by the processor 120.

The RF generator 102 receives the instruction signal having the amounts of the variables and generates an RF signal 124. For example, the processor of the RF generator 102 receives the instruction signal having the amounts of the variables from the processor 120 and generates a signal having the amounts. The processor of the RF generator 102 provides the signal to the driver and amplifier circuit of the RF generator 102. The driver, such as one or more transistors, of the driver and amplifier circuit generates a current signal upon receiving the signal from the processor of the RF generator 102. The amplifier of the driver and amplifier circuit amplifies the current signal to output an amplified current signal and sends the amplified current signal to the RF power supply of the RF generator 102. The RF power supply oscillates to generate the RF signal 124 having the amounts of the variables. The RF signal 124 is supplied by the RF generator 102 via the output O1, the RF cable 116, and the input I2 to impedance matching circuit 104.

The impedance matching circuit 104 matches an impedance of a load coupled to the output O2 of the impedance matching circuit 104 with an impedance of a source coupled to the input I2 of the impedance matching circuit 104 to output a modified RF signal 126 at the output O2. An example of the load includes the RF transmission line 118 and the plasma chamber 108. An example of the source includes the RF cable 116 and the RF generator 102.

The modified RF signal 126 is transferred via the RF transmission line 118 to the lower electrode of the chuck 112. While the modified RF signal 120 is being provided or supplied at the output O2 during the no plasma test, the current sensor 106 measures an amount of current, such as a root mean square current (Irms), being delivered at the output O2. A current is an example of a parameter. Each amount of current measured by the current sensor 106 is a root mean square (rms) of multiple amounts of current supplied at the output O2. The current sensor 106 provides the measurement of the amount of current, such as Irms, at the output O2 via the connection cable 121 to the processor 120.

The processor 120 receives the measurement of the amount of current and generates a database, such as a table or a listing, including a correspondence between the amount of current and the amount of delivered power for which the amount of current Irms is measured. For example, when the processor 120 controls the RF generator 102 to generate the RF signal 124 having an amount Pdel1 of delivered power, the current sensor 106 measures an amount Irms1 of current being delivered at the output O2. Delivered power is another example of the parameter. The processor 120 stores the correspondence, such as a one-to-one relationship or a linking or an association or a mapping, between the amounts Pdel1 and Irms1 in the database, which is stored in the memory device 122. In a similar manner, when the processor 120 controls the RF generator 102 to generate the RF signal 124 having another amount Pdel2 of delivered power, the current sensor 106 measures another amount Irms2 of current delivered at the output O2 and provides the amount Irms2 to the processor 120 via the connection cable 121. The processor 120 stores a correspondence between the amounts Pdel2 and Irms2 in the database. In this manner, over a period of time t, multiple correspondences between amounts of power delivered via the RF signal 124 by the RF generator 102 and amounts of current measured at the output O2 are created or determined by the processor 120 and stored in the database.

It should be noted that processor 120 calibrates the RF generator 102 to determine amounts, such as P_del1, P_del2, etc., of power to be delivered P_del by the RF generator 102 at the output O1. For example, the RF generator 102 is coupled via the RF cable 116 to a dummy load, such as a 50 ohm load, which is a load having a resistance of 50 ohms. The dummy load is sometimes referred to herein as a known load. A measurement device, such as a voltage and current sensor or a power sensor, is coupled to an input of the dummy load and is coupled to the processor 120. The processor 120 generates an instruction signal to control the RF generator 120 to supply an RF signal at the output O1. Upon receiving the instruction signal, the RF generator 102 generates the RF signal and supplies the RF signal via the output O1 and the RF cable 116 to the dummy load. The measurement device measures an amount of power at the input of the dummy load. The amount of power measured at the input accounts for an amount of power loss in the RF cable 116. The processor 120 receives the amount of power measured and determines a correspondence between the amount of power supplied by the RF generator 102 and the amount of power measured at the input of the dummy load to determine an amount of power to be delivered by the RF generator 102. For example, the processor 120 determines a difference between the amount of power supplied by the RF generator 102 at the output O1 and the amount of power measured at the input of the dummy load. The difference is equal to an amount of the power loss in the RF cable 116. The processor 120 adds the difference to the amount of power supplied by the RF generator 120 to calculate an amount of power, such as Pdel1, to be delivered by the RF generator 120. The processor 120 stores in the database a correspondence, such as a one-to-one relationship or a link or an association or a mapping, between the amount of power, such as Psup1, supplied by the RF generator 120 and the amount of power delivered, such as Pdel1, by the RF generator 122 to account for the amount of power loss in the RF cable 116. In this manner, the database having the multiple amounts, such as Pdel1, Pdel2, etc., of delivered power at the output O1 and having multiple amounts, such as Psup1, Psup2, etc., of supplied power at the output O1 is created by the processor 120. The database includes the correspondence between the amounts of power supplied by the RF generator 102 at the output O1 and the amounts of power delivered by the RF generator 102 at the output O1.

It should be noted that the power delivered P_del at the output O1 of the RF generator 102 is sometimes referred to herein as power delivered at the input I2 of the impedance matching circuit 104 because the power delivered P_del at the output O1 is calibrated to account for power loss in the RF cable 116.

In one embodiment, the impedance matching circuit is sometimes referred to herein as a match or a match network or an impedance matching network or a match housing, and these terms are used herein interchangeably.

In an embodiment, instead of the upper electrode 114 being coupled to the ground potential, the lower electrode is coupled to the ground potential and the upper electrode 114 is coupled to an RF transmission line, The RF transmission line 118 is coupled to the output O2 of the impedance matching circuit 118 for receiving the modified RF signal 126.

In one embodiment, instead of the processor 120, multiple processors are used. For example, functions described herein as performed by the processor 120 are performed instead in a distributed manner by the processors. Moreover, instead of the memory device 122, multiple memory devices are used. For example, information stored in the memory device 122 is distributed and stored among the memory devices.

In one embodiment, functions described herein as being performed by the processor 120 and the processor of the RF generator 102 are instead performed by the processor 120 or the processor of the RF generator 102 or by more than two processors.

In an embodiment, in addition to the RF generator 102, one or more additional RF generators are coupled to the impedance matching circuit 104. For example, the RF generator 102 is a kHz RF generator and the additional RF generators include two MHz RF generators. As another example, the RF generator 102 is a MHz RF generator and the additional RF generators include two MHz RF generators. The one or more additional RF generators are coupled via corresponding one or more additional RF cables to corresponding one or more additional inputs of the impedance matching circuit 104. The one or more additional RF generators generate corresponding one or more additional RF signals and provide the one or more additional RF signals via the corresponding one or more additional RF cables to the impedance matching circuit 104. The impedance matching circuit 104 matches an impedance of the load to that of a source coupled to the input I2 and to the corresponding one or more additional inputs of the impedance matching circuit 104 to output a modified RF signal at the output O2. Examples of the source coupled to the input I2 and to the corresponding one or more additional inputs of the impedance matching circuit 104 include the one or more additional RF cables, the RF cable 116, the RF generator 102, and the one or more additional RF generators.

In one embodiment, instead of being coupled to the output O2, the current sensor 106 is coupled at any point on the RF transmission line 108 or is coupled at an input I3 of the chuck 112 for measuring an amount of current being delivered at the point or the input I3. In this embodiment, an amount of power loss that occurs from the output O1 of the RF generator 120 until the point on the RF transmission line 108 or the input I3 is determined and compensated for.

Figure 2:
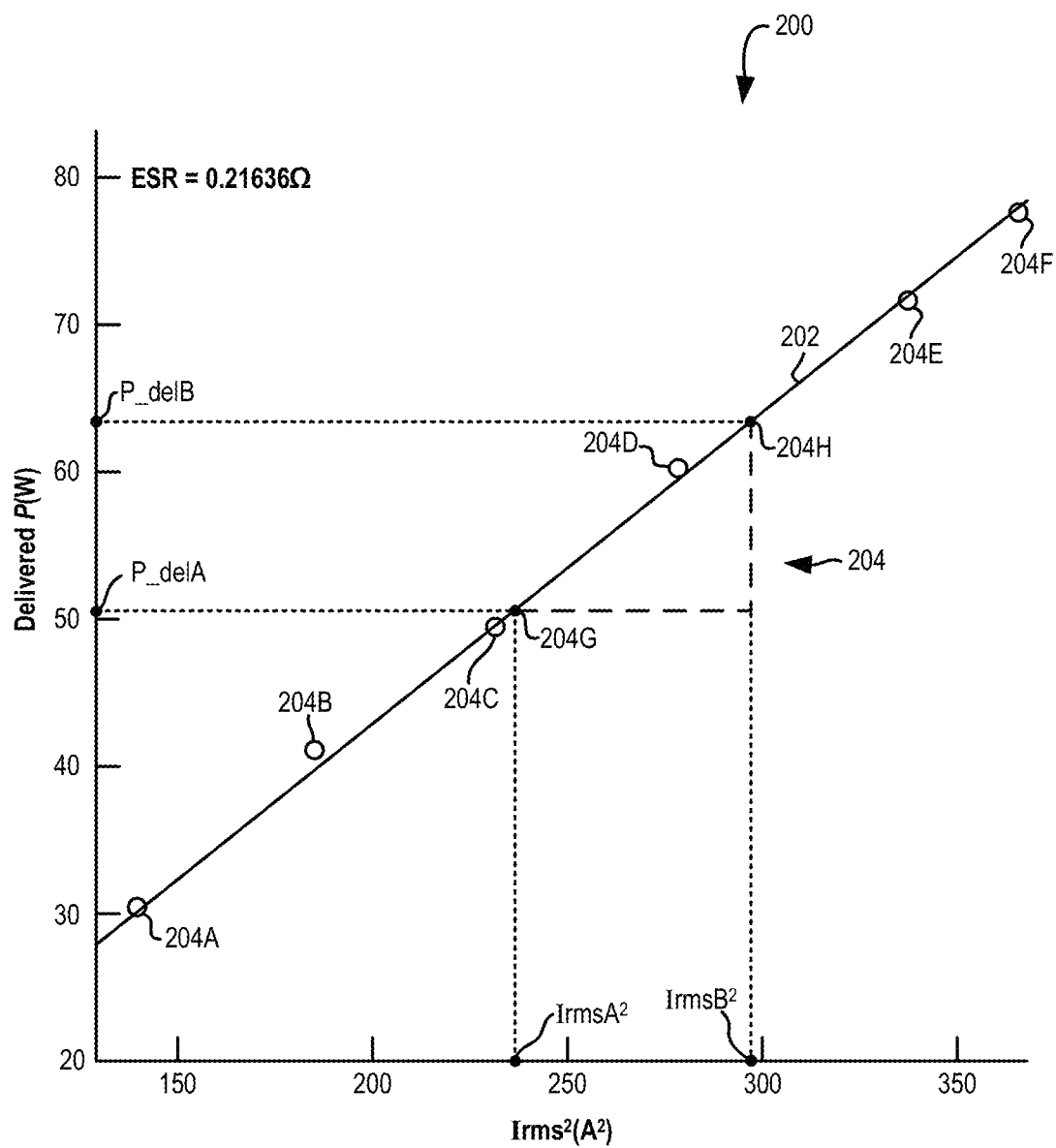
FIG. 2 is an embodiment of a graph to illustrate a determination of a resistance, such as an equivalent series resistance (ESR), associated with an output of an impedance matching circuit.

FIG. 2 is an embodiment of a graph 200 to illustrate a determination of a resistance, such as an equivalent series resistance (ESR), associated with the output O2 of the impedance matching circuit 104 (FIG. 1). The resistance associated with the output O2 is a constant and a combination, such as a sum, of a resistance of the RF cable 116 and a resistance of the circuit components of the impedance matching circuit 104. The circuit components of the impedance matching circuit 104 are coupled between the input I2 and the output O2 of the impedance matching circuit 104.

The graph 200 plots, in a plot 202, the power delivered at the output O1 of the RF generator 102 on a y-axis and a square of an amount of current that is measured at the output O2 corresponding to the delivered power (FIG. 1) on an x-axis. The delivered power at the output O1 is measured in watts (W). During or after the no plasma test, the processor 120 accesses, such as reads or obtains, the amounts, e.g., Pdel1, Pdel2, etc., of delivered power at the output O1 from the memory device 122. For example, before processing a substrate, the processor 120 accesses the amounts of delivered power at the output O1 from the memory device 122. The square of the amounts of current is plotted on the x-axis as $Irms^2$, and Irms is measured by the current sensor 106 in amperes. Also, during or after the no plasma test, the processor 120 further accesses the amounts, such as Irms1, Irms2, etc., from the memory device 120. The amounts that are accessed correspond to the amounts of delivered power that are accessed by the processor 120 from the memory device 122. During or after the no plasma test, the processor 120 calculates squares of the amounts of current delivered at the output O2 from the amounts of measured current stored in the database to plot the graph 200.

Also, during or after the no plasma test, the processor 120, plots in the graph 200, the amount Pdel1 of power delivered at the output O1 versus square $Irms1^2$ of the amount Irms1 of current delivered at the output O2 and plots the amount Pdel2 of power delivered at the output O2 versus square $Irms2^2$ of the amount Irms2 of current delivered at the output O2. To illustrate, a point 204A in the graph 200 represents the amounts Pdel1 and $Irms1^2$ and another point 204B in the graph 200 represents the amounts Pdel2 and $Irms2^2$. Similarly, the graph 200 includes other points 204C, 204D, 204E, and 204F, and each of the points 204C, 204D, 204E, and 204F corresponds to an amount of power delivered at the output O1 of the RF generator 102 and to a square of an amount of current delivered at the output O2 of the impedance matching circuit 104.

During or after the no plasma test, the processor 120 generates the plot 202 from the points 204A, 204B, 204C, 204D, 204E, and 204F. For example, the processor 120 performs a linear regression analysis to fit a line to pass through the points 204A, 204B, 204C, 204D, 204E, and 204F. Each point 204A through 204F plots an amount of delivered power at the output O1 versus the square of an amount of current delivered at the output O2.

Furthermore, during or after the no plasma test, the processor 120 calculates a slope of the plot 202. For example, the processor 120 identifies multiple points 204G and 204H located on the plot 202, projects the point 204G horizontally towards the y-axis to determine an amount P_delB of delivered power at the output O1 of the RF generator 102, projects the point 204H horizontally towards the y-axis to determine an amount P_delA of delivered power at the output O1 of the RF generator 102, projects the point 204G vertically towards the x-axis to determine a square $IrmsA^2$ of an amount IrmsA of current at the output O1 of the RF generator 102, and projects the point 204H vertically towards the x-axis to determine a square $IrmsB^2$ of an amount IrmsB of current at the output O1 of the RF generator 102. The processor 120 calculates a first difference between the amounts P_delB and P_delA and a second difference between the amounts $IrsmB^2$ and $IrmsA^2$, and calculates a ratio of the first difference and the second difference to determine the slope of the plot 202. The processor 120 stores the slope as the resistance ESR associated with the output O2 of the impedance matching circuit 104.

Figure 3:
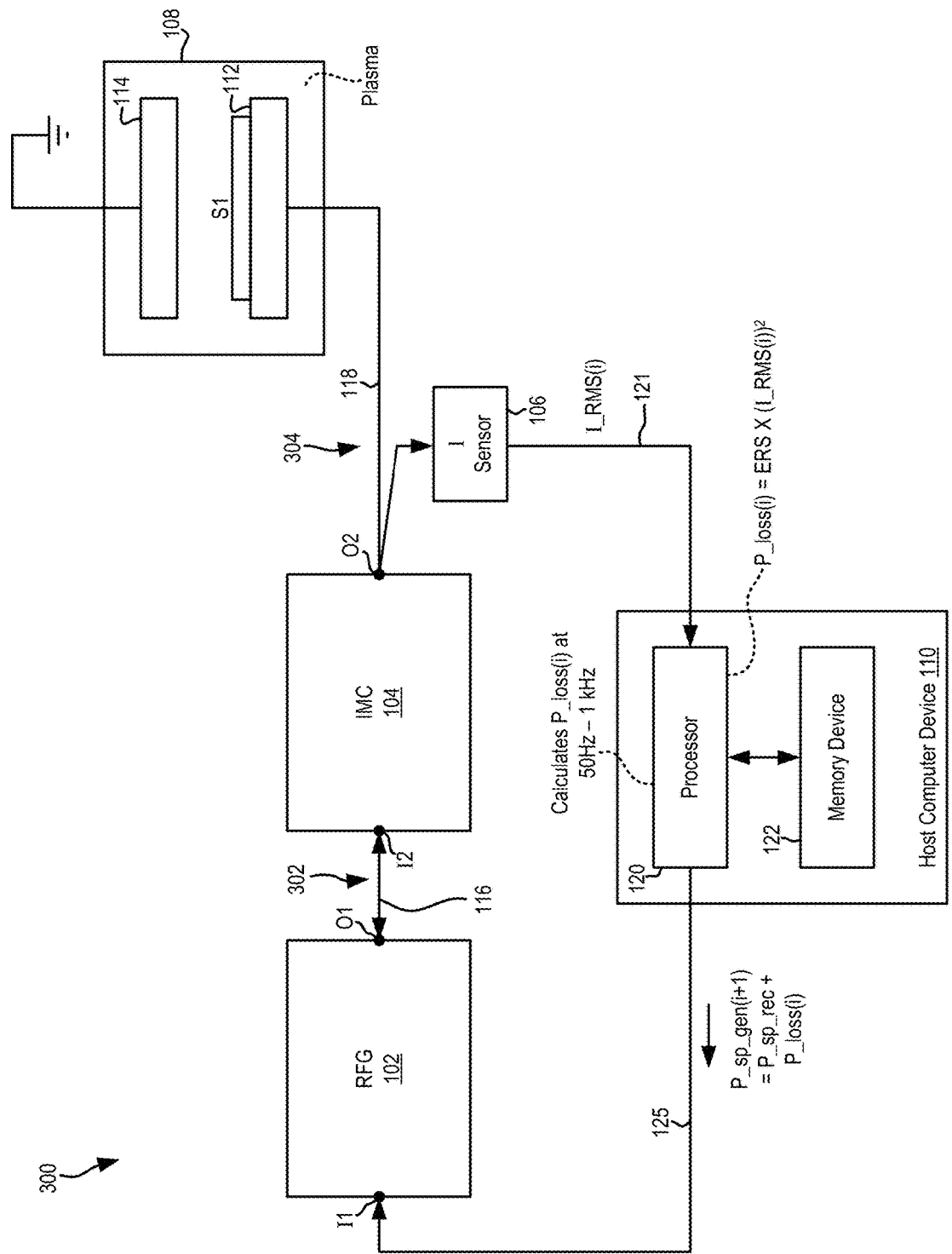
FIG. 3 is a diagram of an embodiment of a system to illustrate use of the resistance to determine an amount of power to be generated and delivered by a radio frequency (RF) generator to account for a loss of power associated with an impedance matching circuit and a transmission line.

FIG. 3 is a diagram of an embodiment of a system 300 to illustrate use of the resistance ESR associated with the output O2 of the impedance matching circuit 104 to determine an amount P_sp_gen(i+1) of power to be generated and delivered by the RF generator 102 to account for a loss of power associated with the RF cable 116 and the impedance matching circuit 104. The system 300 is the same in structure to the system 100 of FIG. 1. For example, the system 300 includes the same components as the system 100. To illustrate, the system 300 includes the RF generator 102, the RF cable 116, the impedance matching circuit 104, the RF transmission line 118, the plasma chamber 108, the current sensor 106, and the host computing device 110.

The plasma chamber 108 includes a substrate S1, such as a semiconductor wafer, for being processed. Examples of processing a substrate include depositing one or more materials on the substrate, etching the substrate, sputtering the substrate, and cleaning the substrate. The substrate S1 is placed on the top surface of the chuck 112 for being processed.

During a first time period, which is represented by an integer i, the processor 120 generates an instruction signal having an amount P_sp_rec of power to be generated and output or supplied by the RF generator 102 at the output O1. The terms time period, time increment, and time step are used herein interchangeably. The amount P_sp_rec is sometimes referred to herein as a recipe set point of operation of the RF generator 102, where "sp" refers to the set point and "rec" refers to a recipe. The processor 120 accesses, such as reads, the amount P_sp_rec from the memory device 122. The recipe set point of operation is provided to the processor 120 by a user via an input device, such as a mouse or a keyboard or a keypad, of the host computing device 110. The input device is coupled to the processor 120 via a connection cable.

Moreover, during the first time period, the processor 120 sends the instruction signal having the amount P_sp_rec via the connection cable 125 and the input I1 to the RF generator 102. Upon receiving the instruction signal, the RF generator 102 generates an RF signal 302 having the amount P_sp_rec of power and supplies the RF signal 302 via the output O1 and the RF cable 116 and the input I2 to the impedance matching circuit 104. During the first time period, the RF signal 302 is generated in the same manner in which the RF signal 124 (FIG. 1) is generated. For example, the processor of the RF generator 102 receives the instruction signal having the amount P_sp_rec and generates a signal having the amount. The processor of the RF generator 102 provides the signal having the amount to the driver and amplifier circuit of the RF generator 102. The driver of the driver and amplifier circuit generates a current signal upon receiving the signal from the processor of the RF generator 102. The amplifier of the driver and amplifier circuit amplifies the current signal to output an amplified current signal and sends the amplified current signal to the RF power supply of the RF generator 102. The RF power supply oscillates to generate and supply the RF signal 302 having the amount P_sp_rec of power.

Within the first time period, the impedance matching circuit 104 receives the RF signal 302 at the input I2 and matches an impedance of the load coupled to the output O2 with that of the source coupled to the input I2 to output a modified RF signal 304 at the output O2. The impedance matching circuit 104 provides the modified RF signal 304 via the output O2 and the RF transmission line 118 to the lower electrode of the chuck 112. Moreover, the one or more process gases are supplied to the plasma chamber 108. When the one or more process gases are supplied to the plasma chamber 108 and the modified RF signal 304 is received by the lower electrode of the plasma chamber 108, plasma is stricken and maintained within the plasma chamber 108 and the plasma processes the substrate S1.

While the modified RF signal 304 is being provided at the output O2 during the first time period, the current sensor 106 measures an amount I_RMS(i) of current delivered at the output O2, where i is the integer equal to or greater than zero. The amount I_RMS(i) is a root mean square of multiple amounts of current delivered at the output O2. The current sensor 106 provides the amount I_RMS(i) of current via the connection cable 121 to the processor 120. While the substrate S1 is being processed, the processor 120 stores the amount I_RMS(i) in the memory device 122, accesses, such as reads or obtains, the amount I_RMS(i) from the memory device 122, and calculates a square I_RMS(i)$^2$ of the amount I_RMS(i) of current during the first time period. The processor 120 also stores the square I_RMS(i)$^2$ in the memory device 122. Also, during the first time period in which the substrate S1 is being processed in the plasma chamber 108, the processor 120 accesses, such as reads or obtains, the amount of resistance ESR associated with the output O2 and the value I_RMS(i)$^2$ from the memory device 122 and multiplies the resistance ESR with the square I_RMS(i)$^2$ of the amount of current to calculate or determine an amount P_loss(i) of loss of RF power at the output O2 of the impedance matching circuit 104. The amount P_loss(i) is combined amount of loss of power in or by the RF cable 116 and loss of power in or by the circuit components of the impedance matching circuit 104 between the input I2 and the output O2 of the impedance matching circuit 104. Within the first time period, the processor 120 determines or calculates a sum P_sp_gen(i+1) of the amount P_sp_rec and the amount P_loss(i) of power associated with the output O2 to output an amount P_sp_gen(i+1) of delivered power, where "gen" refers to the RF generator 102.

During a second time period in which the substrate S1 is being processed, instead of continuing to generate the instruction signal having the amount P_sp_rec of power, the processor 120 generates an instruction signal having the amount P_sp_gen(i+1) of delivered power and sends the instruction signal via the connection cable 125 and the input I1 to the RF generator 102 to adjust, such as change or modify, the recipe set point P_sp_rec of operation of the RF generator 102. As an example, the second time period is next to, such as consecutive to, the first time period. To illustrate, there is no time period between the first time period and the second time period. As another example, the second time period follows the first time period after some time.

Moreover, during the second time period, upon receiving the instruction signal having the amount P_sp_gen(i+1), the RF generator 102 generates the RF signal 302 having the amount P_sp_gen(i+1) of delivered power at the output O1. The RF generator 102 processes the instruction signal having the amount P_sp_gen(i+1) to output the RF signal 302 having the amount P_sp_gen(i+1) in the same manner as described above for outputting the RF signal 302 having the amount P_sp_rec of power. For example, during the second time period, the processor 120 adjusts, such as modifies or changes, the recipe set point P_sp_rec to achieve the amount P_sp_gen(i+1), and provides an instruction signal having the amount P_sp_gen(i+1) to the RF generator 102 via the connection cable 125. Upon receiving the instruction signal, the processor of the RF generator 102 generates and sends a signal having the amount P_sp_gen(i+1) to the driver and amplifier circuit of the RF generator 102. Upon receiving the signal having the amount P_sp_gen(i+1), the driver and amplifier circuit generates a current signal based on the amount P_sp_gen(i+1) and provides the current signal to the power supply of the RF generator 102. The power supply of the RF generator 102 oscillates according to the current signal to output the RF signal 302 having the amount P_sp_gen(i+1).

The RF signal 302 having the amount P_sp_gen(i+1) of delivered power is supplied by the RF generator 102 via the output O1, the RF cable 116, and the input I2 to the impedance matching circuit 104. The impedance matching circuit 104 matches an impedance of the load coupled to the output O2 with an impedance of the source coupled to the input I2 to modify the RF signal 302 having the amount P_sp_gen(i+1) of delivered power to output the modified RF signal 304. The lower electrode receives the modified RF signal 304 that is output based on the amount P_sp_gen(i+1) of delivered power to process the substrate S1. The modified RF signal 304 is received by the lower electrode via the output O2 and the RF transmission line 118.

Again during the second time period, the current sensor 106 measures an amount I_RMS(i+1) of current delivered at the output O2 and provides the amount to the processor 120 via the connection cable 121. The processor stores the amount I_RMS(i+1) in the memory device 122. During the second time period, the processor 120 accesses, such as obtains or reads, the amount I_RMS(i+1) from the memory device 122, and determines or calculates an amount P_loss(i+1) of delivered power loss at the output O2 by multiplying a square of the amount I_RMS(i+1) with the resistance ESR associated with the output O2. Moreover, during the second time period, the processor 120 calculates a sum of the amount P_sp_rec of power and the amount of power loss P_loss(i+1) to output an amount P_sp_gen(i+2) of delivered power.

During a third time period in which the substrate S1 is being processed, the processor 120 controls the RF generator 102 to generate the RF signal 302 having the amount P_sp_gen(i+2) of delivered power to adjust the recipe set point P_sp_rec of power supplied at the output O1. For example, during the third time period, the processor 120 adjusts, such as modifies or changes, the recipe set point P_sp_rec to achieve the amount P_sp_gen(i+2), and provides an instruction signal having the amount P_sp_gen(i+2) to the RF generator 102 via the connection cable 125. Upon receiving the instruction signal from the processor 120, the processor of the RF generator 102 sends a signal having the amount P_sp_gen(i+2) to the driver and amplifier circuit of the RF generator 102. Upon receiving the signal having the amount P_sp_gen(i+2), the driver and amplifier circuit generates a current signal based on the amount P_sp_gen(i+2) and provides the current signal to the power supply. The power supply oscillates according to the current signal to output the RF signal 302 having the amount P_sp_gen(i+2). The third time period is consecutive to the second time period. In a similar manner, during additional time periods in which the substrate S1 is being processed, the processor 120 continues to control the RF generator 102 to change an amount of delivered power of the RF signal 302 to account or compensate for power loss associated with the output O2, e.g., at the output O2, etc., of the impedance matching circuit 104.

FIG. 4 is an embodiment of a table 400 to illustrate a method in which during processing of the substrate S1 or another substrate, the processor 120 continues to modify the amount of delivered power at the output O1 of the RF generator 102 based on the amount of power loss associated with the output O2 of the impedance matching circuit 104 (FIG. 3). The table 400 includes a listing of a time step, a listing of a corrective offset applied to the recipe set point P_sp_rec, a generator set point, a loss of power P_loss associated with the output O2, an amount of power coupled to the plasma within the plasma chamber 108 (FIG. 1) and a next time step corrective offset. Examples of loss of power P_loss include P_loss(i) and P_loss(i+1). The loss of power P_loss is used to adjust the recipe set point P_sp_rec when an amount of the loss of power is added to the recipe set point P_sp_rec. The corrective offset, the generator set point, the loss of power, the amount of power coupled to the plasma and the next time corrective offset are measured in watts (W).

Examples of the time step include the first time period, the second time period, and the third time period. For example, the first time period is an example of a time step 0, the second time period is an example of a time step 1, and the third time period is an example of a time step 2. As another example, the first time period is an example of a time step 4, the second time period is an example of a time step 5, and the third time period is an example of a time step 6. As another example, the first time period is an example of a time step 3, the second time period is an example of the time step 4, and the third time period is an example of the time step 5.

Examples of the generator set point include the amount P_sp_rec as an initial generator recipe set point, the amount P_sp_gen(i+1), and the amount P_sp_gen(i+2). Moreover examples of the loss of power associated with the output O2 include the amount P_loss(i) and the amount P_loss(i+1). During each time step, the loss of power associated with the output O2 is the same as the next time step corrective offset. For example, the corrective offset is 5 W during the time step 2 and is the same as the loss of power of 5 W during the time step 1.

During the time step 0, the processor 120 controls the RF generator 102 to generate the RF signal 302 (FIG. 3) having an amount of 500 W. The amount 500 W is an example of the recipe set point P_sp_rec of power. Moreover, during the time step 0, the processor 120 accesses an amount of 5 W of loss of delivered power associated with the output O2 from the memory device 122. The amount 5 W of loss of delivered power at the output O2 is calculated by the processor 120 by multiplying a square of an amount of current, such as I_RMS(i), measured by the current sensor 106 (FIG. 3) with the resistance ESR. The amount of current I_RMS(i) is measured by the current sensor 106 during the time step 0. Also during the time step 0, an amount of 495 W of delivered power is coupled with the plasma used to process the substrate S1. The amount 495 W is a difference between the amount 500 W of power of the RF signal 302 and the amount 5 W of power loss at the output O2. During the time step 0, the processor 120 determines the amount of 5 W of the next time step corrective offset to be equal to the amount of 5 W of power loss associated with the output O2.

During the time step 1, the processor 120 calculates a sum of the recipe set point of 500 W and the next time step correct offset of 5 W determined during the time step 0, and controls the RF generator 102 to generate the RF signal 302 having an amount of 505 W, which is the sum. The amount 505 W is an example of the amount P_sp_gen(i+1) of power delivered by the RF generator 102 at the output O1 of the RF generator 102. Moreover, during the time step 1, the processor 120 accesses an amount of 8 W of loss of delivered power at the output O2 from the memory device 122. The amount 8 W of loss of delivered power is calculated by the processor 120 by multiplying a square of an amount of current, such as I_RMS(i+1), measured by the current sensor 106 (FIG. 3), with the resistance ESR. The amount of current I_RMS(i+1) is measured by the current sensor 106 during the time step 1. Also during the time step 1, an amount of 497 W of delivered power is coupled with the plasma used to process the substrate S1. The amount 497 W is a difference between the amount 505 W of delivered power of the RF signal 302 and the amount 8 W of power loss associated with the output O2. During the time step 1, the processor 120 determines an amount of 8 W of the next time step corrective offset to be equal to the amount of 8 W of power loss associated with the output O2.

During the time step 2, the processor 120 calculates a sum of the recipe set point of 500 W and the next time step correct offset of 8 W determined during the time step 1, and controls the RF generator 102 to generate the RF signal 302 having an amount of 508 W, which is the sum. The time step 2 is consecutive to the time step 1. The amount 508 W is an example of the amount P_sp_gen(i+2) of power delivered by the RF generator 102. Moreover, during the time step 2, the processor 120 accesses an amount of 9 W of loss of delivered power at the output O2 from the memory device 122. The amount 9 W of loss of delivered power at the output O2 is calculated by the processor 120 by multiplying a square of an amount of current, such as I_RMS(i+2), measured by the current sensor 106 (FIG. 3), with the resistance ESR. The amount I_RMS(i+2) is stored by the processor 120 in the memory device 122. The amount of current I_RMS(i+2) is measured by the current sensor 106 during the time step 2. Also during the time step 2, an amount of 499 W of delivered power is coupled with the plasma used to process the substrate S1. The amount 499 W is a difference between the amount 508 W of delivered power of the RF signal 302 and the amount 9 W of power loss associated with the output O2. During the time step 2, the processor 120 determines an amount of 9 W of the next time step corrective offset to be equal to the amount of 9 W of power loss associated with the output O2.

During the time step 3, the processor 120 calculates a sum of the recipe set point of 500 W and the next time step correct offset of 9 W determined during the time step 2, and controls the RF generator 102 to generate the RF signal 302 having an amount of 509 W, which is the sum. The time step 3 is consecutive to or follows the time step 2. The amount 509 W is an example of an amount P_sp_gen(i+3) of power delivered by the RF generator 102. Moreover, during the time step 3, the processor 120 accesses an amount of 10 W of loss of delivered power at the output O2 from the memory device 122. The amount 10 W of loss of delivered power at the output O2 is calculated by the processor 120 by multiplying a square of an amount of current, such as I_RMS(i+3), measured by the current sensor 106 (FIG. 3), with the resistance ESR. The amount 10 W is measured by the current sensor 106 and provided to the processor 120. The amount of current I_RMS(i+3) is measured by the current sensor 106 during the time step 3. Also during the time step 3, an amount of 499 W of delivered power is coupled with the plasma used to process the substrate S1. The amount 499 W is a difference between the amount 509 W of delivered power of the RF signal 302 and the amount 10 W of power loss associated with the output O2. During the time step 3, the processor 120 determines an amount of 10 W of the next time step corrective offset to be equal to the amount of 10 W of power loss associated with the output O2.

During the time step 4, the processor 120 calculates a sum of the recipe set point of 500 W and the next time step correct offset of 10 W determined during the time step 3, and controls the RF generator 102 to generate the RF signal 302 having an amount of 510 W, which is the sum. The time step 4 is consecutive to or follows the time step 3. The amount 510 W is an example of an amount P_sp_gen(i+4) of power delivered by the RF generator 102. Moreover, during the time step 4, the processor 120 accesses an amount of 10.5 W of loss of delivered power at the output O2 from the memory device 122. The amount 10.5 W of loss of delivered power at the output O2 is calculated by the processor 120 by multiplying a square of an amount of current, such as I_RMS(i+4), measured by the current sensor 106 (FIG. 3), with the resistance ESR. The amount of current I_RMS(i+4) is measured by the current sensor 106 during the time step 4. Also during the time step 4, an amount of 499.5 W of delivered power is coupled with the plasma used to process the substrate S1. The amount 499.5 W is a difference between the amount 510 W of delivered power of the RF signal 302 and the amount 10.5 W of power loss associated with the output O2. During the time step 4, the processor 120 determines an amount of 10.5 W of the next time step corrective offset to be equal to the amount of 10.5 W of power loss associated with the output O2.

During the time step 5, the processor 120 calculates a sum of the recipe set point of 500 W and the next time step correct offset of 10.5 W determined during the time step 4, and controls the RF generator 102 to generate the RF signal 302 having an amount of 510.5 W, which is the sum. The time step 5 is consecutive to or follows the time step 4. The amount 510.5 W is an example of an amount P_sp_gen(i+5) of power delivered by the RF generator 102. Moreover, during the time step 5, the processor 120 accesses an amount of 10.6 W of loss of delivered power associated with the output O2 from the memory device 122. The amount 10.6 W of loss of delivered power at the output O2 is calculated by the processor 120 by multiplying a square of an amount of current I_RMS(i+5) measured by the current sensor 106 (FIG. 3), with the resistance ESR. The amount of current, such as I_RMS(i+5), is measured by the current sensor 106 during the time step 5. Also during the time step 5, an amount of 499.9 W of delivered power is coupled with the plasma used to process the substrate S1. The amount 499.9 W is a difference between the amount 510.5 W of delivered power of the RF signal 302 and the amount 10.6 W of power loss associated with the output O2. During the time step 5, the processor 120 determines an amount of 10.6 W of the next time step corrective offset to be equal to the amount of 10.6 W of power loss associated with the output O2.

During the time step 6, the processor 120 calculates a sum of the recipe set point of 500 W and the next time step correct offset of 10.6 W determined during the time step 5, and controls the RF generator 102 to generate the RF signal 302 having an amount of 510.6 W, which is the sum. The time step 6 is consecutive to or follows the time step 5. The amount 510.6 W is an example of an amount P_sp_gen(i+6) of power delivered by the RF generator 102. Moreover, during the time step 6, the processor 120 accesses an amount of 10.6 W of loss of delivered power at the output O2 from the memory device 122. The amount 10.6 W of loss of delivered power at the output O2 calculated by the processor 120 by multiplying a square of an amount of current, such as I_RMS(i+6), measured by the current sensor 106 (FIG.

3), with the resistance ESR. The amount of current I_RMS (i_6) is measured by the current sensor 106 during the time step 6. The amount of current I_RMS(i+6) is stored by the processor 120 in the memory device 122 and is accessed, such as read or obtained, by the processor 120 from the memory device 122. Also during the time step 6, an amount of 500 W of delivered power is coupled with the plasma used to process the substrate S1. The amount 500 W is a difference between the amount 510.6 W of delivered power of the RF signal 302 and the amount 10.6 W of power loss associated with the output O2. During the time step 6, the processor 120 determines an amount of 10.6 W of the next time step corrective offset to be equal to the amount of 10.6 W of power loss associated with the output O2.

In this manner, the processor 120 continues to control an amount of power delivered by the RF generator 102 at the output O1 of the RF generator 102 based on an amount of power loss measured at the output O2 of the impedance matching circuit 104 until the amount of power loss is compensated for. The amount of power loss is compensated for when the amount of power loss stabilizes. For example, during the time steps 5 and 6, the processor 120 determines that the same amount of power loss of 10.6 W has occurred based on an amount of current measured as being delivered at the output O2 by the current sensor 106 and the resistance ESR associated with the output O2. Upon determining that the amount of power loss is stable, the processor 120 does not control the RF generator 102 to change an amount of power delivered by the RF generator 102 at the output O1 of the RF generator 102. For example, after the time step 6, the processor 120 continues to control the RF generator 102 to deliver the amount of 510.6 W of power at the output O1 of the RF generator 102 and does not change the amount of 510.6 W. To further illustrate, after the time step 6, the current sensor 106 is decoupled from the output O2 of the impedance matching circuit 104. There is no need to continue to measure the current at the output O2 to determine the amount of delivered power loss at the output O2.

In one embodiment, instead of determining the same amount of power loss for two consecutive time steps, the processor 120 determines that amounts of power losses during the two consecutive time steps are within a predetermined range from each other to determine that the amount of power loss the latter of the two time steps is stable. For example, assuming that an amount of power loss during the time step 5 is 10.61 W instead of 10.6 W and given that the amount of power loss during the time step 6 is 10.6 W, the processor 120 determines that the amounts 10.6 W and 10.61 W are within the predetermined range of 0.1 W or 0.2 W from each other to determine that the amount of 10.6 W of power loss is stable during the time step 6. As another example, assuming that an amount of power loss during the time step 5 is 10.62 W instead of 10.6 W and given the amount of power loss during the time step 6 is 10.6 W, the processor 120 determines that the amounts 10.6 W and 10.62 W are within the predetermined range of 0.2 W or 0.3 W from each other to determine that the amount of 10.6 W of power loss during the time step 6 is stable.

In an embodiment, repetition of a method of measuring the current at the output O2 of the impedance matching circuit 104, determining an amount of power loss at the output O2 of the impedance matching circuit 104 from the measurement of the current and the resistance ESR, determining the amount of power to be delivered by the RF generator 102 from the amount of power loss and the recipe set point of the RF generator 102 occurs at a rate that ranges from 50 hertz (Hz) to 1 kHz. For example, the measurement of an amount, such as I_RMS(i), of the current at the output O2, the determination of the amount P_loss(i) from the measurement I_RMS(i) and the resistance ESR, and the determination of the amount P_sp_gen(i+1) from the recipe set point P_sp_rec and the amount P_loss(i) are iteratively repeated 50 times per second or 1000 times per second or a number of times between 50 times per second and 1000 times per second. As another example, 50 or 1000 time steps, examples of which are provided above with respect to table 400, occur during one second. During each time step, the amount, such as I_RMS(i), of the current is measured at the output O2, the amount P_loss(i) is determined from the measurement I_RMS(i) and the resistance ESR, and the amount P_sp_gen(i+1) is determined from the recipe set point P_sp_rec and the amount P_loss(i).

In one embodiment, the amount 510 W is an example of the amount P_sp_gen(i) of power delivered by the RF generator 102, the amount 510.5 W is an example of the amount P_sp_gen(i+1) of power delivered by the RF generator 102, and the amount 510.6 W is an example of the amount P_sp_gen(i+2) of power delivered by the RF generator 102.

Figure 5:
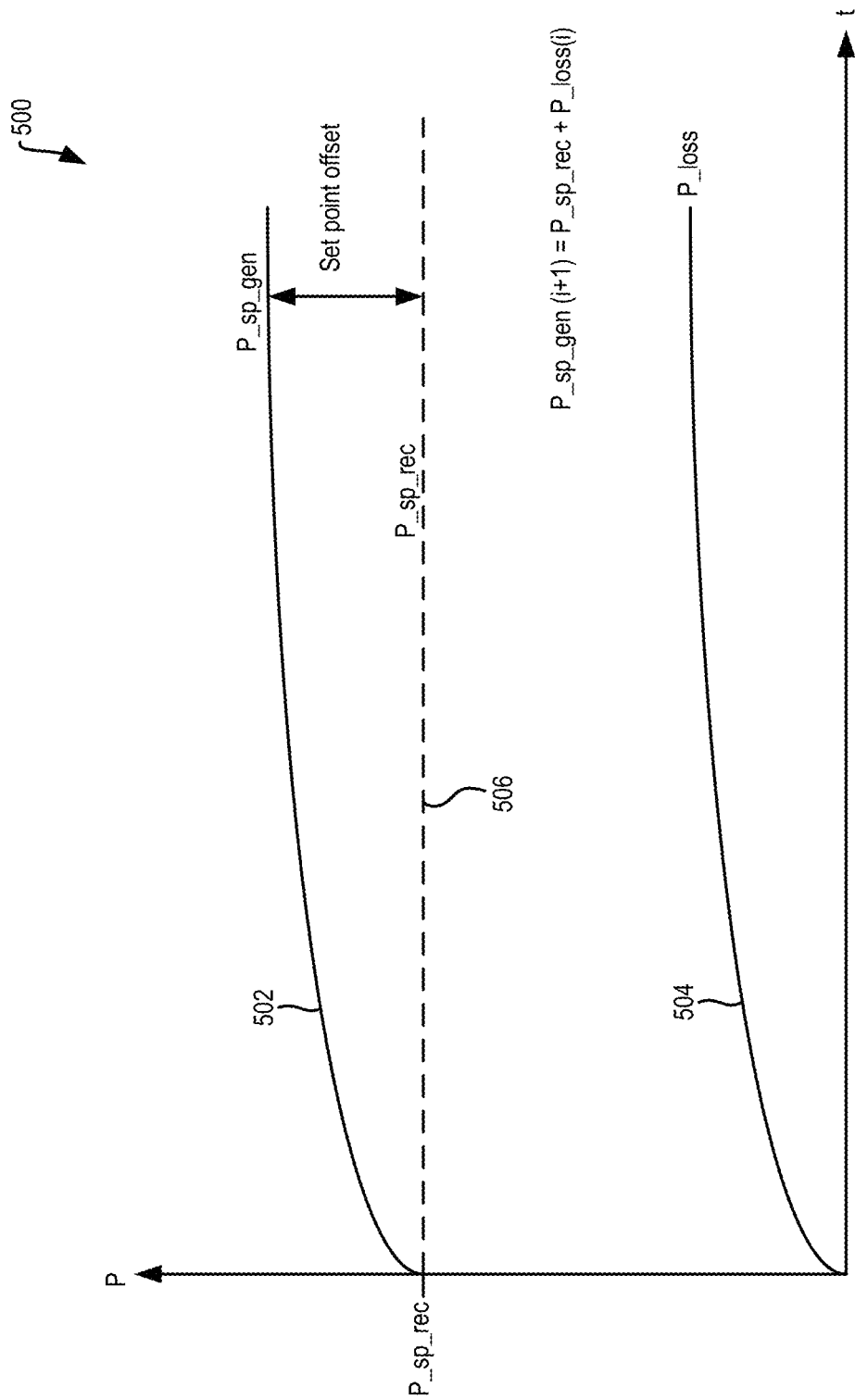
FIG. 5 is an embodiment of a graph to illustrate that power that is delivered by the RF generator changes to account for a loss of power delivered at the output of the impedance matching circuit.

FIG. 5 is an embodiment of a graph 500 to illustrate that power P_sp_gen that is delivered by the RF generator 102 (FIG. 3) at the output O1 changes to account for a loss of power P_loss delivered at the output O2 of the impedance matching circuit 104 (FIG. 3). It should be noted that "sp" in the term "P_sp_gen" represents a set point and "gen" in the term "P_sp_gen" represents the RF generator 102. The graph 500 plots the power P_sp_gen that is delivered by the RF generator 102 versus the time t. The graph 500 includes a plot 502, another plot 504, and yet another plot 506. The plot 502 plots the delivered power P_sp_gen at the output O1 of the RF generator 102. Moreover, the plot 504 plots the loss of power P_loss delivered at the output O2 of the impedance matching circuit 104 and the plot 506 plots the recipe set point P_sp_rec, which is a constant amount.

As illustrated in the graph 500, with an increase in an amount of the loss of delivered power P_loss, such as P_loss(i), P_loss(i+1), P_loss(i+2), etc., over the time t, there is an increase in an amount of power delivered P_sp_gen, e.g., P_sp_gen(i), P_sp_gen(i+1), P_sp_gen(i+2), P_sp_gen(i+3), P_sp_gen(i+4), P_sp_gen(i+5), P_sp_gen (i+6), etc., over the time t. By accounting for the loss of delivered power P_loss, uniformity in processing the substrate S1 (FIG. 4) or another substrate is achieved over the time t. It should be noted that a difference between the delivered power P_sp_gen and the recipe set point P_sp_rec is referred to herein as a set point offset.

Figure 6:
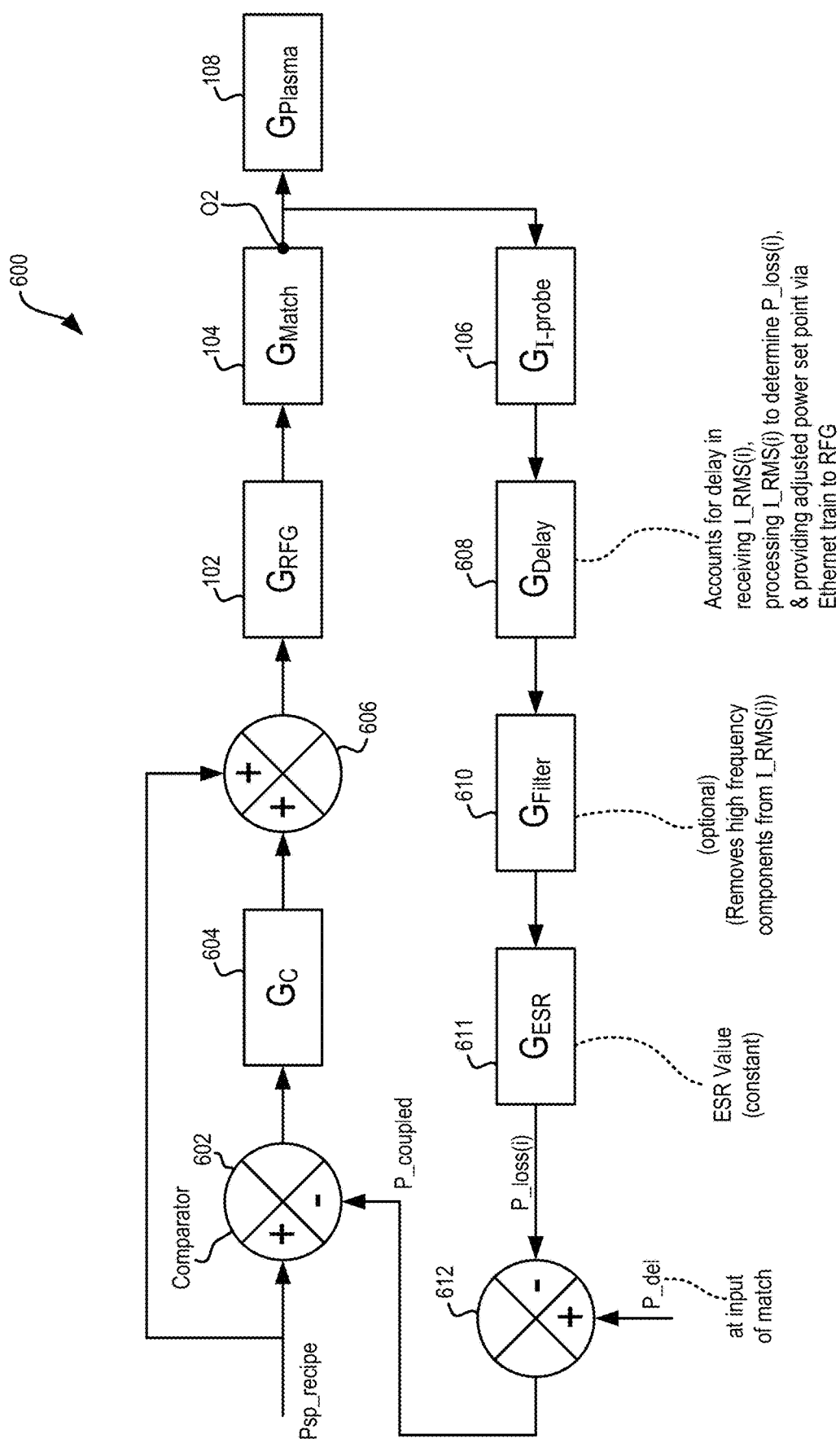
FIG. 6 is a diagram of an embodiment of a system to illustrate an application of a method for compensating for the loss of delivered power.

FIG. 6 is a diagram of an embodiment of a system 600 to illustrate an application of the method for compensating for the loss of delivered power. The system 600 includes a comparator 602, a controller 604, an adder 606, the RF generator 102, the impedance matching circuit 104, the plasma chamber 108, the current sensor 106, a delay circuit 608, a filter 610, a controller 611, and a comparator 612.

Examples of the controller 604 include the processor 120 (FIG. 3), an ASIC, a PLD, a CPU, a microprocessor, and a microcontroller. Another example of the controller 604 includes a combination of the processor 120 and the processor of the RF generator 102. Examples of the comparator 602 or the comparator 612 include a controller, a processor, a PLD, a CPU, a microprocessor, and a microcontroller. Each of the adder 606, the delay circuit 608, and the filter 610 may be implemented using a controller, a processor, a PLD, a CPU, a microprocessor, and a microcontroller. An example of the filter 610 includes a low pass filter that filters out high frequencies of a current I_RMS.

The comparator 602 is coupled to the controller 604, which is coupled to the adder 606. The adder 606 is coupled to the RF generator 102 via a connection cable. Also, the delay circuit 608 is coupled to the current sensor 106 via a connection cable. The delay circuit 608 is coupled to the filter 610, which is coupled to the controller 611. The controller 611 is coupled to the comparator 612, which is coupled to the comparator 602.

The current sensor 106 measures and provides an amount of the current I_RMS, such as the amount I_RMS(i), I_RMS(i+1), I_RMS(i+2), I_RMS(i+3), I_RMS(i+4), I_RMS(i+5), or I_RMS(i+6), etc., measured during processing of a substrate or amounts of the current Irms measured during the no plasma test to the delay circuit 608. The delay circuit 608 accounts for, such as reduces or removes, a time delay associated with the current I_RMS measured during processing of a substrate or associated with the current Irms measured during the no plasma test. For example, the delay circuit 608 reduces or removes a time delay in a reception of the amount of current I_RMS from the current sensor 106 by the processor 120, a time delay in processing by the processor 120 of the measurement of the current I_RMS and the resistance ESR to determine the power loss P_loss at the output O2 of the impedance matching circuit 102, and a time delay in determining by the processor 120 of the amount of power delivered P_sp_gen from the power loss P_loss and the recipe set point P_sp_rec. As another example, the delay circuit 608 reduces or removes a time delay in a reception of an amount of the current Irms from the current sensor 106 by the processor 120. The delay circuit 608 reduces or removes the time delay associated with the current I_RMS and the time delay associated with the current Irms, and provides the measurement of the current I_RMS or the measurements, e.g., amounts, etc., of the current Irms to the filter 610.

The filter 610 removes, such as filters, high-frequency components of the amount of the current I_RMS or the amounts of the current Irms that is measured by the current sensor 106. The controller 611 determines the value of the resistance ESR from a relationship, illustrated in the graph 200 (FIG. 2), between amounts of the current Irms measured by the current sensor 106 and amounts of the delivered power P_del. The controller 611 also determines an amount of the power loss P_loss from the resistance ESR and a square of the current I_RMS, and provides the amount of the delivered power loss P_loss to the comparator 612.

The comparator 612 compares an amount of power that is delivered to the input I2 of the impedance matching circuit 104 with the amount of the delivered power loss P_loss to determine an amount of delivered power P_coupled that is coupled to the plasma within the plasma chamber 108. The power that is delivered to the input I2 is represented as P_del. The comparator 612 provides the amount of delivered power P_coupled that is coupled to the plasma to the comparator 602.

Furthermore, the comparator 602 compares the amount of power P_coupled that is coupled to the plasma within the plasma chamber 108 with the recipe set point P_sp_rec to determine an amount of the delivered power loss P_loss at the output O2 of the impedance matching circuit 104. The controller 604 receives the amount of the loss of the delivered power P_loss at the output O2 of the impedance matching circuit 104 from the comparator 602 and provides the amount of the loss to the adder 606. The adder 606 adds the amount of the loss of the delivered power P_loss at the output O2 of the impedance matching circuit 104 with the recipe set point P_sp_rec to generate a sum set point or a total set point, which is provided as an input to the RF generator 102 via the connection cable. The RF generator 102 is operated to generate and provide the sum set point of delivered power at the output O1 of the RF generator 102.

In one embodiment, the delay circuit 608, the filter 610, the controller 611, the comparator 612, the comparator 602, the controller 604, and the adder 606 are implemented within the processor 120. For example, the delay circuit 608, the filter 610, the controller 611, the comparator 612, the comparator 602, the controller 604, and the adder 606 are parts of the processor 120.

In an embodiment, the filter 610 is optional and may not be used in the system 600. For example, the delay circuit 608 is coupled to the controller 611 without being coupled to the filter 610.

In one embodiment, the functions described herein as being performed by the delay circuit 608, the filter 610, the controller 611, the comparator 612, the comparator 602, the controller 604, and the adder 606 are performed by one or more processors. For example, functions described herein as being performed by the delay circuit 608, the filter 610, and the controller 611 are performed by one processor and functions described herein as being performed by the comparator 612, the comparator 602, the controller 604, and the adder 606 are performed by another processor, such as the processor 120.

FIG. 7 is a diagram of an embodiment of a system 700 to illustrate that the amount of delivered power P_sp_gen determined by applying the method illustrated with respect to FIG. 3 or FIG. 4 is maintained for processing another substrate S2 after the substrate S1 is processed. The system 700 includes the same components as that of the system 300 except that the system excludes the current sensor 106. The current sensor 106 is not coupled to the output O2 of impedance matching circuit 104. For example, the current sensor 106 is decoupled from the output O2 of the impedance matching circuit 104. Moreover, the substrate S1 that is placed on the top surface of the chuck 112 is removed from the plasma chamber 108, and after the substrate S1 is removed, the substrate S2 is placed on the top surface for being processed.

Once the processor 120 determines the amount, such as P_sp_gen(i+1), or P_sp_gen(i+10), or 510.6 W (FIG. 4), of delivered power to be supplied by the RF generator 102 for which the amount of power loss P_loss is within the predetermined range over multiple time steps, such as multiple time periods, the processor 120 does not change the amount of delivered power to be supplied by the RF generator 102. For example, the processor 120 during each time step that follows the time step 6 of FIG. 4 provides an instruction signal having the amount of 510.6 W to the RF generator 102 for generating the RF signal 302 having the amount 510.6 W of delivered power. Upon receiving the instruction signal having the amount of 510.6 W, the RF generator 102 generates the RF signal 302 having the amount 510.6 W and provides the RF signal 302 via the output O1 and the input I2 to the impedance matching circuit 104.

Upon receiving the RF signal 302, the impedance matching circuit 104 matches in impedance of the load coupled to the output O2 with that of the source coupled to the input I2 to output the modified RF signal 304. When the one or more process gases are supplied to the plasma chamber 108 and the modified RF signal 304 is supplied to the lower electrode of the chuck 112, plasma is stricken or maintained within the plasma chamber 108. The plasma within the plasma chamber 108 processes the substrate S2 placed within the plasma chamber 108.

In one embodiment, instead of controlling the RF generator 102 to provide the same amount of delivered power at the output O1 of the RF generator 102 for processing the substrate S2, the method illustrated with respect to FIGS. 3 and 4 of measuring the current I_RMS at the output O2 of the impedance matching circuit, determining the power loss P_loss at the output O2 from the current I_RMS and the resistance ESR, determining the delivered power P_sp_gen to be applied to the RF generator 104 based on the power loss P_loss and the recipe set point P_sp_rec is repeated for the substrate S2 for one or more time steps after processing the substrate S1. The delivered power P_sp_gen that is determined for the substrate S2 is then applied to the substrate S2 for additional time steps.

In an embodiment, the method, described herein, for compensating for RF power loss applies to other types of semiconductor processing tools, such as an inductively coupled plasma (IC) tool or an electron cyclotron resonance (ECR) tool or a plasma enhanced chemical vapor deposition (PECVD) tool. For example, instead of the CCP plasma chamber 108, an ICP plasma chamber, an ECR plasma chamber, or a PECVD plasma chamber is used. To illustrate, the RF transmission line 118 is coupled to a lower electrode of the ICP plasma chamber. In this illustration, a transformer coupled plasma (TCP) coil of the ICP plasma chamber is coupled to a ground potential or to one or more RF generators via an impedance matching circuit. As another illustration, the RF transmission line 118 is coupled to a pedestal of the PECVD plasma chamber. As yet another example, the RF transmission line 118 is coupled to a TCP coil of the ICP plasma chamber. In this illustration, a lower electrode of the ICP plasma chamber is coupled to a ground potential or to one or more RF generators via an impedance matching circuit. It should be noted that the plasma chamber 108 is a type of a semiconductor processing tool.

Embodiments, described herein, may be practiced with various computer system configurations including hand-held hardware units, microprocessor systems, microprocessor-based or programmable consumer electronics, minicomputers, mainframe computers and the like. The embodiments, described herein, can also be practiced in distributed computing environments where tasks are performed by remote processing hardware units that are linked through a computer network.

In some embodiments, a controller is part of a system, which may be part of the above-described examples. The system includes semiconductor processing equipment, including a processing tool or tools, chamber or chambers, a platform or platforms for processing, and/or specific processing components (a wafer pedestal, a gas flow system, etc.). The system is integrated with electronics for controlling its operation before, during, and after processing of a semiconductor wafer or substrate. The electronics is referred to as the "controller," which may control various components or subparts of the system. The controller, depending on processing requirements and/or a type of the system, is programmed to control any process disclosed herein, including a delivery of process gases, temperature settings (e.g., heating and/or cooling), pressure settings, vacuum settings, power settings, RF generator settings, RF matching circuit settings, frequency settings, flow rate settings, fluid delivery settings, positional and operation settings, wafer transfers into and out of a tool and other transfer tools and/or load locks connected to or interfaced with the system.

Broadly speaking, in a variety of embodiments, the controller is defined as electronics having various integrated circuits, logic, memory, and/or software that receive instructions, issue instructions, control operation, enable cleaning operations, enable endpoint measurements, and the like. The integrated circuits include chips in the form of firmware that store program instructions, digital signal processors (DSP)s, chips defined as ASICs, PLDs, one or more microprocessors, or microcontrollers that execute program instructions (e.g., software). The program instructions are instructions communicated to the controller in the form of various individual settings (or program files), defining operational parameters for carrying out a process on or for a semiconductor wafer. The operational parameters are, in some embodiments, a part of a recipe defined by process engineers to accomplish one or more processing steps during the fabrication of one or more layers, materials, metals, oxides, silicon, silicon dioxide, surfaces, circuits, and/or dies of a wafer.

The controller, in some embodiments, is a part of or coupled to a computer that is integrated with, coupled to the system, otherwise networked to the system, or a combination thereof. For example, the controller is in a "cloud" or all or a part of a fab host computer system, which allows for remote access for wafer processing. The controller enables remote access to the system to monitor current progress of fabrication operations, examines a history of past fabrication operations, examines trends or performance metrics from a plurality of fabrication operations, to change parameters of current processing, to set processing steps to follow a current processing, or to start a new process.

In some embodiments, a remote computer (e.g. a server) provides process recipes to the system over a computer network, which includes a local network or the Internet. The remote computer includes a user interface that enables entry or programming of parameters and/or settings, which are then communicated to the system from the remote computer. In some examples, the controller receives instructions in the form of settings for processing a wafer. It should be understood that the settings are specific to a type of process to be performed on a wafer and a type of tool that the controller interfaces with or controls. Thus as described above, the controller is distributed, such as by including one or more discrete controllers that are networked together and working towards a common purpose, such as the fulfilling processes described herein. An example of a distributed controller for such purposes includes one or more integrated circuits on a chamber in communication with one or more integrated circuits located remotely (such as at a platform level or as part of a remote computer) that combine to control a process in a chamber.

Without limitation, in various embodiments, a plasma system includes a plasma etch chamber, a deposition chamber, a spin-rinse chamber, a metal plating chamber, a clean chamber, a bevel edge etch chamber, a physical vapor deposition (PVD) chamber, a chemical vapor deposition (CVD) chamber, an atomic layer deposition (ALD) chamber, an atomic layer etch (ALE) chamber, an ion implantation chamber, a track chamber, and any other semiconductor processing chamber that is associated or used in fabrication and/or manufacturing of semiconductor wafers.

It is further noted that although the above-described operations are described with reference to a parallel plate plasma chamber, in some embodiments, the above-described operations apply to other types of plasma chambers, e.g., a transformer coupled plasma (TCP) reactor, dielectric tools, a plasma chamber including an electron cyclotron resonance (ECR) reactor, etc. An example of the TCP reactor includes an inductively coupled plasma (ICP) reactor. Another example of the TCP reactor includes a conductor tool. Sometimes, the terms reactor and plasma chamber are used herein interchangeably.

As noted above, depending on a process operation to be performed by the tool, the controller communicates with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

With the above embodiments in mind, it should be understood that some of the embodiments employ various computer-implemented operations involving data stored in computer systems. These computer-implemented operations are those that manipulate physical quantities.

Some of the embodiments also relate to a hardware unit or an apparatus for performing these operations. The apparatus is specially constructed for a special purpose computer. When defined as a special purpose computer, the computer performs other processing, program execution or routines that are not part of the special purpose, while still being capable of operating for the special purpose.

In some embodiments, the operations, described herein, are performed by a computer selectively activated, or are configured by one or more computer programs stored in a computer memory, or are obtained over a computer network. When data is obtained over the computer network, the data may be processed by other computers on the computer network, e.g., a cloud of computing resources.

One or more embodiments, described herein, can also be fabricated as computer-readable code on a non-transitory computer-readable medium. The non-transitory computer-readable medium is any data storage hardware unit, e.g., a memory device, etc., that stores data, which is thereafter read by a computer system. Examples of the non-transitory computer-readable medium include hard drives, network attached storage (NAS), ROM, RAM, compact disc-ROMs (CD-ROMs), CD-recordables (CD-Rs), CD-rewritables (CD-RWs), magnetic tapes and other optical and non-optical data storage hardware units. In some embodiments, the non-transitory computer-readable medium includes a computer-readable tangible medium distributed over a network-coupled computer system so that the computer-readable code is stored and executed in a distributed fashion.

Although some method operations, described above, were presented in a specific order, it should be understood that in various embodiments, other housekeeping operations are performed in between the method operations, or the method operations are adjusted so that they occur at slightly different times, or are distributed in a system which allows the occurrence of the method operations at various intervals, or are performed in a different order than that described above.

It should further be noted that in an embodiment, one or more features from any embodiment described above are combined with one or more features of any other embodiment without departing from a scope described in various embodiments described in the present disclosure.

Although the foregoing embodiments have been described in some detail for purposes of clarity of understanding, it will be apparent that certain changes and modifications can be practiced within the scope of appended claims. Accordingly, the present embodiments are to be considered as illustrative and not restrictive, and the embodiments are not to be limited to the details given herein, but may be modified within the scope and equivalents of the appended claims.

The invention claimed is:

1. A method for compensating for loss of radio frequency (RF) power, comprising:
   obtaining a plurality of measurements of a plurality of parameters associated with a component of a plasma system;
   determining from the plurality of measurements of the plurality of parameters a resistance associated with the component of the plasma system;
   obtaining a first value of one of the plurality of parameters associated with the component of the plasma system;
   determining a first amount of loss of RF power associated with the component of the plasma system from the resistance and the first value of the one of the plurality of parameters;
   adjusting a set point of operation of an RF generator based on the first amount of loss of RF power, wherein said adjusting the set point of operation of the RF generator based on the first amount of loss of RF power is performed to control the RF generator to operate at a second set point;
   obtaining a second value of the one of the plurality of parameters associated with the component of the plasma system;
   determining a second amount of loss of RF power from the resistance and the second value of the one of the plurality of parameters; and
   adjusting the set point of operation of the RF generator based on the second amount of loss of RF power, wherein said adjusting the set point of operation of the RF generator based on the second amount of loss of RF power is performed to control the RF generator to operate at a third set point,
   wherein the set point of operation is adjusted based on the first and second amounts of loss of RF power to compensate for loss of RF power.

2. The method of claim 1, wherein the set point is adjusted to compensate for loss of RF power when multiple amounts of loss of RF power are within a pre-determined range from each other.

3. The method of claim 1, wherein said obtaining the plurality of measurements and determining the resistance are performed during or after a no-plasma test.

4. The method of claim 1, wherein said obtaining the first value, said determining the first amount of loss of RF power, said adjusting the set point based on the first amount of loss of RF power, said obtaining the second value, said determining the second amount of loss of RF power, and said adjusting the second point based on the second amount of loss of RF power are performed during processing of a substrate.

5. The method of claim 1, wherein the component of the plasma system is an impedance matching circuit.

6. The method of claim 1, wherein said determining the first amount of loss of RF power comprises multiplying the resistance with a square of the first value of the one of the plurality of parameters.

7. The method of claim 1, wherein said adjusting the set point based on the first amount of loss of RF power includes adding the first amount of loss of RF power to the set point.

8. A controller for compensation for loss of radio frequency (RF) power, comprising:
   a processor configured to:

obtain a plurality of measurements of a plurality of parameters associated with a component of a plasma system;

determine from the plurality of measurements of the plurality of parameters a resistance associated with the component of the plasma system;

obtain a first value of one of the plurality of parameters associated with the component of the plasma system;

determine a first amount of loss of RF power associated with the component of the plasma system from the resistance and the first value of the one of the plurality of parameters;

adjust a set point of operation of an RF generator based on the first amount of loss of RF power, wherein the set point of operation of the RF generator is adjusted based on the first amount of loss of RF power to control the RF generator to operate at a second set point;

obtain a second value of the one of the plurality of parameters associated with the component of the plasma system;

determine a second amount of loss of RF power from the resistance and the second value of the one of the plurality of parameters; and adjust the set point of operation of the RF generator based on the second amount of loss of RF power, wherein the set point of operation is adjusted based on the second amount of loss of RF power to control the RF generator to operate at a third set point, wherein the set point of operation is adjusted based on the first and second amounts of loss of RF power to compensate for loss of RF power; and a memory device coupled to the processor for storing the plurality of measurements of the plurality of parameters.

9. The controller of claim 8, wherein the processor determines that set point is adjusted to compensate for loss of RF power when multiple amounts of loss of RF power are within a pre-determined range from each other.

10. The controller of claim 8, wherein the processor obtains the plurality of measurements and determines the resistance during or after a no-plasma test.

11. The controller of claim 8, wherein the processor obtains the first value of the one of the plurality of parameters, determines the first amount of loss of RF power, adjusts the set point based on the first amount of loss of RF power, obtains the second value, determines the second amount of loss of RF power, and adjusts the second point based on the second amount of loss of RF power during processing of a substrate.

12. The controller of claim 8, wherein the component of the plasma system is an impedance matching circuit.

13. The controller of claim 8, wherein to determine the first amount of loss of RF power, the processor is configured to multiply the resistance with a square of the first value of the one of the parameters.

14. The controller of claim 8, wherein to adjust the set point based on the first amount of loss of RF power, the processor is configured to sum the amount of first loss of RF power and the set point.

15. A plasma system for compensation for loss of radio frequency (RF) power, comprising:
a radio frequency (RF) generator configured to generate an RF signal;
an impedance matching circuit coupled to the RF generator for receiving the RF signal; and
a computer coupled to the RF generator, wherein the computer is configured to:
obtain a plurality of measurements of a plurality of parameters associated with a component of the plasma system;
determine from the plurality of measurements of the plurality of parameters a resistance associated with the component of the plasma system;
obtain a first value of one of the plurality of parameters associated with the component of the plasma system;
determine a first amount of loss of RF power associated with the component of the plasma system from the resistance and the first value of the one of the plurality of parameters;
adjust a set point of operation of the RF generator based on the first amount of loss of RF power, wherein the set point of operation of the RF generator is adjusted based on the first amount of loss of RF power to control the RF generator to operate at a second set point;
obtain a second value of the one of the plurality of parameters associated with the component of the plasma system;
determine a second amount of loss of RF power from the resistance and the second value of the one of the plurality of parameters; and
adjust the set point of operation of the RF generator based on the second amount of loss of RF power, wherein the set point of operation is adjusted based on the second amount of loss of RF power to control the RF generator to operate at a third set point,
wherein the set point of operation is adjusted based on the first and second amounts of loss of RF power to compensate for loss of RF power.

16. The plasma system of claim 15, wherein the computer determines that the set point is adjusted to compensate for loss of RF power when multiple amounts of loss of RF power are within a pre-determined range from each other.

17. The plasma system of claim 15, wherein to adjust the set point based on the first amount of loss of RF power, the computer is configured to sum the first amount of loss of RF power and the set point.

18. The plasma system of claim 15, wherein to adjust the set point based on the second amount of loss of RF power, the computer is configured to sum the second amount of loss of RF power and the set point.

19. The method of claim 1, wherein said adjusting the set point based on the second amount of loss of RF power includes adding the second amount of loss of RF power to the set point.

20. The controller of claim 8, wherein to adjust the set point based on the second amount of loss of RF power, the processor is configured to sum the amount of second loss of RF power and the set point.

* * * * *